(12) United States Patent
Waragaya

(10) Patent No.: US 9,147,814 B2
(45) Date of Patent: Sep. 29, 2015

(54) SEMICONDUCTOR LIGHT-EMITTING DEVICE AND MANUFACTURING METHOD

(71) Applicant: Stanley Electric Co., Ltd., Tokyo (JP)

(72) Inventor: Takeshi Waragaya, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/059,656

(22) Filed: Oct. 22, 2013

(65) Prior Publication Data

US 2014/0110736 A1    Apr. 24, 2014

(30) Foreign Application Priority Data

Oct. 23, 2012    (JP) .................. 2012-234038

(51) Int. Cl.
*H01L 33/50*    (2010.01)
*H01L 33/54*    (2010.01)

(52) U.S. Cl.
CPC ............. *H01L 33/50* (2013.01); *H01L 33/505* (2013.01); *H01L 33/507* (2013.01); *H01L 33/54* (2013.01); *H01L 2224/45144* (2013.01); *H01L 2224/49175* (2013.01); *H01L 2224/73265* (2013.01); *H01L 2933/0041* (2013.01)

(58) Field of Classification Search
CPC .. H01L 33/50; H01L 33/54; H01L 2933/0041
USPC .............. 257/81, 98–100; 438/26–27
See application file for complete search history.

(56) References Cited

U.S. PATENT DOCUMENTS

| 2005/0139851 A1* | 6/2005 | Sato ............................ 257/99 |
| 2009/0045422 A1* | 2/2009 | Kato et al. ..................... 257/98 |
| 2012/0211774 A1* | 8/2012 | Harada ......................... 257/88 |
| 2013/0001605 A1* | 1/2013 | Ishihara et al. .................. 257/88 |

FOREIGN PATENT DOCUMENTS

| JP | 2004-343149 A | 12/2004 |
| JP | 2009-94199 A | 4/2009 |
| JP | 2009-135136 A | 6/2009 |

* cited by examiner

*Primary Examiner* — Steven Loke
*Assistant Examiner* — Arash Majdi
(74) *Attorney, Agent, or Firm* — Kenealy Vaidya LLP

(57) ABSTRACT

A semiconductor light-emitting device and a method for manufacturing the same can include a wavelength converting layer located over a semiconductor epitaxial layer in order to emit various colored-lights including white light. The light-emitting device can include a semiconductor chip substrate configured not to transmit light emitted from the epitaxial layer and mounted on a mounting board, and a transparent resin layer located between the wavelength converting layer and the epitaxial layer mounted on the semiconductor chip substrate so as to extend from a side surface of the wavelength converting layer towards a substantially edge portion of the semiconductor chip substrate. The semiconductor light-emitting device can be configured to improve a color variability of a mixture light emitted from the device by using the transparent resin layer and the wavelength converting layer, and therefore can emit the mixture light having a substantially uniform color tone from a small light-emitting surface.

20 Claims, 8 Drawing Sheets

FIG. 4a (Side view)
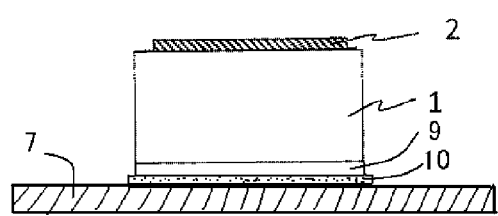
FIG. 4c (Side view)
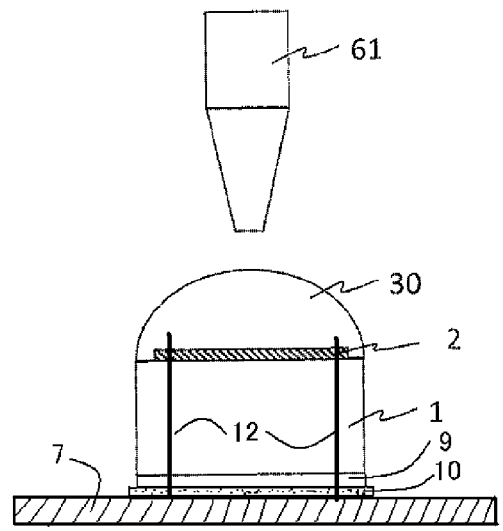
FIG. 4b (Top view)
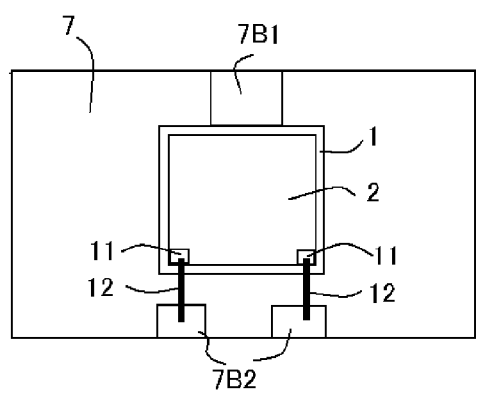
FIG. 4d (Side view)
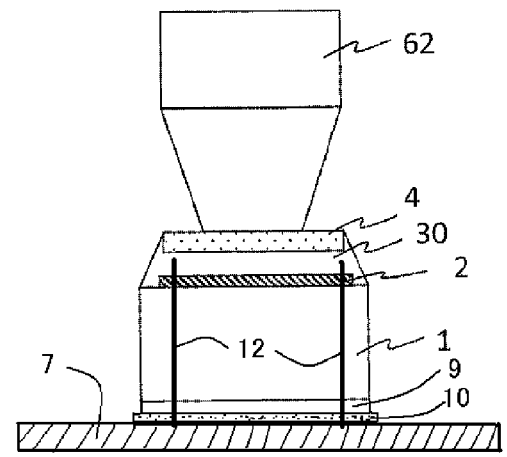

SEMICONDUCTOR LIGHT-EMITTING DEVICE AND MANUFACTURING METHOD

This application claims the priority benefit under 35 U.S.C. §119 of Japanese Patent Application No. 2012-234038 filed on Oct. 23, 2012, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength-converting layer, and to manufacturing methods for the same. More particularly, the disclosed subject matter relates to semiconductor light-emitting devices for a vehicle light and the like, which can emit a mixture light having a high uniformity from a small light-emitting surface, and to methods of manufacturing such devices.

2. Description of the Related Art

Semiconductor light-emitting devices, in which a part of light emitted from a semiconductor light-emitting chip is converted into light having a different light-emitting wavelength by a wavelength converting resin including a phosphor and in which a mixture light comprises the light having the different light-emitting wavelength mixed with the light emitted directly from the semiconductor light-emitting chip is emitted, have been widely known as a light source for various lighting units. As conventional semiconductor light-emitting devices including a wavelength converting material, a first conventional semiconductor light-emitting device is disclosed in Patent Document No. 1 (Japanese Patent Application Laid Open JP2004-343149).

FIG. 6 is an enlarged cross-sectional view showing the first conventional semiconductor light-emitting device, which is disclosed in Patent Document No. 1. The first conventional semiconductor light-emitting device 80 includes: a base board 85 having a bonding pad 86 formed in a rectangular tabular shape; a semiconductor light-emitting chip 81 having a top electrode mounted on the base board 85, and the top electrode being electrically connected to the bonding pad 86 via a bonding wire 87; a transparent encapsulating resin 82 having a top surface disposed on the base board 85 so as to cover the semiconductor light-emitting chip 81 along with the bonding wire 87; and a wavelength converting material 83 including a phosphor, which wavelength-converts a part of light emitted from the semiconductor light-emitting chip 81 into light having a different light-emitting wavelength from a light-emitting wavelength of the light emitted from the semiconductor light-emitting chip 81.

The conventional semiconductor light-emitting device 80 may emit a relatively uniform mixture light, which comprises the light having the different light-emitting wavelength mixed with the light emitted directly from the semiconductor light-emitting chip 81, from a top surface of the wavelength converting material 83. However, the semiconductor light-emitting device 80 may emit light including a comparative large amount of the light wavelength-converted by the phosphor from a side surface of the wavelength converting material 83 because the wavelength-converted light has a long path length in wavelength converting material 83

In addition, the semiconductor light-emitting device 80 may emit light including a large amount of the direct light emitted from the semiconductor light-emitting chip 81 from a side surface of the transparent encapsulating resin 82, because the direct light may not necessarily pass through the wavelength converting material 83. Accordingly, the first conventional light-emitting device 80 may be easy to vary a color tone of the mixture light depending on a light-emitting direction thereof.

FIG. 7a is an enlarged top view showing a second conventional semiconductor light-emitting device, which is disclosed in Patent Document No. 2 (Japanese Patent Application Laid Open JP2009-94199), and FIG. 7b is an enlarged cross-sectional view showing the second conventional semiconductor light-emitting device taken along line B-B' shown in FIG. 7a. The second conventional semiconductor light-emitting device 70 includes: a base board 71 formed in a rectangular tabular shape; a semiconductor light-emitting chip 73 mounted on the base board 71 and emitting blue light during operation; and a wavelength converting material 74 having a side surface 76, an inclined surface 77 and a top surface 78, and including a yellow phosphor 72, which wavelength-converts a part of the blue light into yellow light, and the wavelength converting material 74 disposed on the base board 71 so as to cover the semiconductor light-emitting chip 73 therewith.

The wavelength converting material 74 may be formed in a substantially square frustum such that a square frustum having a bottom surface is exactly located on a square column having a top surface, which is the same square shape as the bottom surface of the square frustum. Therefore, because each of light path lengths emitted from the semiconductor light-emitting chips 73 toward the top surface 78, the inclined surface 77 and the side surface 76 may be approximately same, a color variability of a mixture light emitted from a light-emitting surface of the second conventional semiconductor light-emitting device 70, which is composed of the top surface 78, the inclined surface 77 and the side surface 76, may reduce.

However, each of structures such as the above-described first and second conventional light-emitting devices 80 and 70 are configured to cover the semiconductor light-emitting chips 81 and the semiconductor light-emitting chip 73 with the transparent encapsulating resin 82 and the wavelength converting material 74 along with the base boards 85 and 71, respectively. Consequently, each of parts of lights, which get to the side surface of the transparent encapsulating resin 82 and the side surface 76 and the inclined surface 77 of the wavelength converting material 74, may returns toward the base boards 85 and 71 by reflecting on the side surfaces and the like described above, and may be reflected by the base boards 85 and 71, respectively. Therefore, the above-described structures may be difficult to maintain a high contrast between a light-emitting surface and a non-light-emitting surface in top views of the semiconductor light-emitting devices, although each direction of the top views may be a light-emitting direction of the devices.

When the semiconductor light-emitting devices having such structures are used as a light source for a lighting unit such as a vehicle headlight, which controls light emitted from the semiconductor light-emitting devices using a reflector and/or a projector lens, a light-emitting device having a small light-emitting surface in addition to the high contrast may be desired to efficiently control light emitted from the semiconductor light-emitting device with a small optical structure. Therefore, the semiconductor light-emitting devices disclosed in Patent Documents No. 1 and No. 2 may not be a match for the above-described usage.

A conventional semiconductor light-emitting device having a small light-emitting surface and a high contrast can be used as a light source for a vehicle headlight using a projector lens and is disclosed in Patent Document No. 3 (Japanese Patent Application Laid Open JP2009-135136). FIG. 8a is an enlarged cross-sectional view showing a third conventional semiconductor light-emitting device disclosed in Patent Document No. 3, and FIG. 8b is a graph showing an exemplary high contrast measured from an upward direction of the third conventional device shown in FIG. 8a.

The third conventional semiconductor light-emitting device 90 includes: a semiconductor chip substrate 91 configured not to transmit light; a semiconductor epitaxial layer 92 formed on the chip substrate 91; a wavelength converting layer 94 including a transparent resin 96 and a phosphor 95, disposed on the semiconductor chip substrate 91 so as to cover the semiconductor epitaxial layer 92 therewith, and being formed in a substantially dome shape; and a mounting board 97 mounting the chip substrate 91, which mounts the semiconductor epitaxial layer 92 thereon along with the wavelength converting layer 94.

According to such a structure, the third conventional semiconductor light-emitting device 90 may not emit light from a side surface of the semiconductor chip substrate 91, and also may not reflect light by the mounting board 97 because the semiconductor chip substrate 91 may not transmit light. Accordingly, as shown in FIG. 8b, the third conventional semiconductor light-emitting device 90 can perform a high contrast between a light-emitting surface and a non-light-emitting surface such that a light-emitting intensity thereof sharply rises from the non-light-emitting surface to the light-emitting surface.

In addition, because the above-described structure is forming the wavelength converting layer 94 in the substantially dome shape on the minute semiconductor chip substrate 91 while the wavelength converting layer 94 encapsulates the finer semiconductor epitaxial layer 92 on the minute semiconductor chip substrate 91, the third conventional semiconductor light-emitting device 90 may be used as a point light source as compared with the structure such as the first and the second conventional devices 80 and 70, in which each of the whole semiconductor light-emitting chips 81 and 73 is encapsulated with the transparent resin 82 and the wavelength converting material 74, respectively.

Moreover, because the wavelength converting layer 94 may be formed in the substantially dome shape, thicknesses of the wavelength converting layer 94 in light-emitting directions from the semiconductor epitaxial layer 92 toward a light-emitting surface may be comparatively uniform. Therefore, the third conventional semiconductor light-emitting device 90 may reduce a chromatic variability in the light-emitting directions from the semiconductor epitaxial layer 92 toward the light-emitting surface.

However, technically a path length of light emitted from a middle portion of the semiconductor epitaxial layer 92 in a directly up direction of the semiconductor light-emitting device 90 may be longer than that of light emitted from a peripheral portion of the semiconductor epitaxial layer 92 because the wavelength converting layer 94 is formed in the substantially dome shape. Accordingly, the light emitted from the middle portion of the semiconductor epitaxial layer 92 in the directly up direction of the light-emitting device 90 may include a larger amount of light wavelength-converted by the wavelength converting layer 94 as compared with the light emitted form the peripheral portion of the semiconductor epitaxial layer 92.

When the structure such as the third conventional semiconductor light-emitting device 90 is used as light source for general lighting units such as a general lighting, an indicator and the like, such a slight color variability may not cause any interferences to the general lighting units. However, when the structure is used as a light source for a lighting unit such as a vehicle headlight, which enlarges light emitted from the semiconductor light-emitting device using a reflector and/or a projector lens and projects the light in the distance, the slight color variability may not necessarily neglected in order to provide various expensive-looking lighting units using the reflector and/or the projector lens.

Such the structure may reduce the sight color variability by controlling a thickness and a density of the wavelength converting material 94 near the peripheral portion of the semiconductor epitaxial layer 92. However, because a size of the semiconductor chip substrate 91 may generally be approximately several hundred micro square meters to one square millimeter, it may be difficult for a molding method, which is usually used for a low coast, to control the thickness and the like of the wavelength converting material 94.

The above-referenced Patent Documents are listed below, and are hereby incorporated with their English abstracts in their entireties.
1. Patent Document No. 1: Japanese Patent Application Laid Open JP2004-343149
2. Patent Document No. 2: Japanese Patent Application Laid Open JP2009-94199
3. Patent Document No. 3: Japanese Patent Application Laid Open JP2009-135136

The disclosed subject matter has been devised to consider the above and other problems, features, and characteristics. Thus, embodiments of the disclosed subject matter can include semiconductor light-emitting devices that can emit a mixture light having a high uniform color tone from a small light-emitting surface, in which the mixture light can be emitted with a small color variability along an optical axis thereof, and also can be emitted with a small color variability even in a different light-emitting direction from the optical axis. The embodiments of the disclosed subject matter can also include associated manufacturing methods that do not cause and/or are designed to prevent some of the above-described problems, concerns, and characteristics related to a wavelength converting layer.

SUMMARY

The presently disclosed subject matter has been devised in view of the above and other problems, features, and characteristics. An aspect of the disclosed subject matter includes methods of manufacture that provide semiconductor light-emitting devices, which can a mixture light having a substantially uniform color tone from a small light-emitting surface, and which can provide a similar lead time while using a similar manufacture machine in comparison with conventional semiconductor light-emitting devices and processes.

According to an aspect of the disclosed subject matter, a semiconductor light-emitting device can include: a mounting board having a first conductor pattern and at least one second conductor pattern formed on a mounting surface thereof; a semiconductor chip substrate having a substantially edge portion located between a top surface and a side surface thereof and a bottom electrode formed underneath a bottom surface thereof, being mounted adjacent the mounting surface thereof via a conductive adhesive layer, and thereby the bottom electrode thereof being electrically connected to the first conductor pattern of the mounting board via the conductive adhesive layer; and a semiconductor epitaxial layer having a substantially center located on a top surface thereof, at least one top electrode formed on the top surface thereof and an optical axis intersected with the substantially center thereof at a right angle, mounted on the top surface of the semiconductor chip substrate, each of the top surface and the bottom surface thereof being smaller than the top surface of the semiconductor chip substrate, each of the bottom surface of the semiconductor epitaxial layer and the top surface of the semiconductor chip substrate contacting with respect to each other, and the top electrode being electrically connected to the second conductor pattern of the mounting board.

In addition, the semiconductor light-emitting device can also include: a wavelength converting layer having a substantially edge portion located between a side surface and a bottom surface thereof, including at least one phosphor, formed in a substantially uniform thickness between a top surface and the bottom surface thereof, and being located over the top surface of the semiconductor epitaxial layer, the bottom surface thereof facing the top surface of the semiconductor epitaxial layer, and therefore being either smaller than the top surface of the semiconductor epitaxial layer or substantially equal to the top surface of the semiconductor epitaxial layer; a transparent resin layer having a side surface disposed on the top surface of the semiconductor epitaxial layer and the top surface of the semiconductor chip substrate, and covering at least the substantially edge portion of the wavelength converting layer, the side surface of the transparent resin layer extending from the side surface of the wavelength converting layer to the substantially edge portion of the semiconductor chip substrate, and therefore inclining from the side surface of the wavelength converting layer toward the substantially edge portion; and wherein the semiconductor chip substrate is configured with a reflective substrate.

In the above-described exemplary semiconductor light-emitting device, the side surface of the transparent resin layer can be formed in at least one of a substantially linear shape and a convex shape in an opposite direction of the semiconductor epitaxial layer. The semiconductor epitaxial layer can be a metallic bonding chip emitting blue light and the at least one phosphor of the wavelength converting layer can be selected from the group consisting of a yellow phosphor, and two phosphors including a red phosphor layer and a green phosphor layer. The semiconductor epitaxial layer can also be a metallic bonding chip emitting an ultraviolet light and the at least one phosphor includes at least one of a red phosphor, a green phosphor, and a blue phosphor.

In addition, the wavelength converting layer can include at least one cutout section so that the cutout section exposes the top electrode of the semiconductor epitaxial layer from the semiconductor epitaxial layer in a top view of the wavelength converting layer. The wavelength material layer can also be any one of a phosphor film formed in a sheeted shape that is made by dispersing at least one phosphor in a transparent resin, a phosphor plate formed in a tabular shape that is made by dispersing at least one phosphor in a transparent resin, a phosphor plate that is made by sintering at least one phosphor, and a phosphor plate that is composed of a phosphor glass.

Moreover, the wavelength converting layer can also be composed of a transparent plate, which is formed in a substantially uniform tabular shape, and a wavelength converting resin including at least one phosphor, which is formed in a substantially uniform thickness underneath the transparent plate, and the side surface of the transparent resin layer can extend from a part of the transparent plate on the side surface of the wavelength converting layer to the substantially edge portion of the semiconductor chip substrate. In this case, the device including the above-described structure can also include semiconductor light-emitting chips with the above-described structures as set forth above.

According to the above-described exemplary semiconductor light-emitting device, because the semiconductor chip substrate is configured not to transmit the light emitted from the semiconductor epitaxial layer 2 and can be used to form a small device, the device can emit a mixture light from a small light-emitting surface. Furthermore, the device can emit the mixture light having a substantially uniform color tone from the top surface of the wavelength converting layer because its thickness is the substantially uniform thickness, and also can emit a mixture light having the similar uniform color tone as described above from the side surface of the transparent resin layer by mixing light including a comparative large amount of light wavelength-converted emitted from the side surface of the wavelength converting layer due to a long path length with a weak direct light emitted from the semiconductor epitaxial layer toward the side surface of the transparent resin layer. Thus, the disclosed subject matter can provide semiconductor light-emitting devices that can emit a mixture light having a substantially uniform color tone from a small light-emitting surface.

Another aspect of the disclosed subject matter includes methods for manufacturing the above-described semiconductor light-emitting devices. An exemplary method can include: providing the mounting board and the semiconductor chip substrate forming the semiconductor epitaxial layer on the top surface of the semiconductor chip substrate; mounting the semiconductor chip substrate on the first conductor pattern of the mounting board via the conductive adhesive layer; wire-bonding between the top electrode of the semiconductor epitaxial layer and the second conductor pattern of the mounting board via the bonding wire; disposing an uncured transparent resin on the top surfaces of the semiconductor chip substrate and the semiconductor epitaxial layer; and disposing the wavelength converting layer on the uncured transparent resin using a substantially uniform surface tension between the side surface of the wavelength converting layer and the uncured transparent resin.

In the above-described exemplary method for manufacturing semiconductor light-emitting devices, the same or similar variations of the device can also be employed as set forth above.

According to the exemplary manufacturing method described above for the semiconductor light-emitting devices, the wavelength converting layer can be disposed on the transparent resin layer by mounting the wavelength converting layer on an uncured transparent resin. The transparent resin layer can be solidified by a similar method as compared to conventional processes. Thus, the method can provide semiconductor light-emitting devices having a small light-emitting surface and a high uniform color tone using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein:

FIG. 1b is an enlarged cross-sectional view showing the semiconductor light-emitting device taken along line A-A' shown in FIG. 1a;

FIGS. 4a and 4d are explanatory views showing an exemplary manufacturing method for the semiconductor light-emitting device shown in FIGS. 1a and 1b, in which FIGS. 4a, 4c and 4d are side views and FIG. 4b is a top view;

FIG. 7b is an enlarged cross-sectional view showing the second conventional semiconductor light-emitting device taken along line B-B' shown in FIG. 7a; FIG. 8b is a graph showing an exemplary high contrast measured from in an upward direction of the third conventional device shown in FIG. 8a.

DETAILED DESCRIPTION OF EXEMPLARY EMBODIMENTS

Figure 1A:
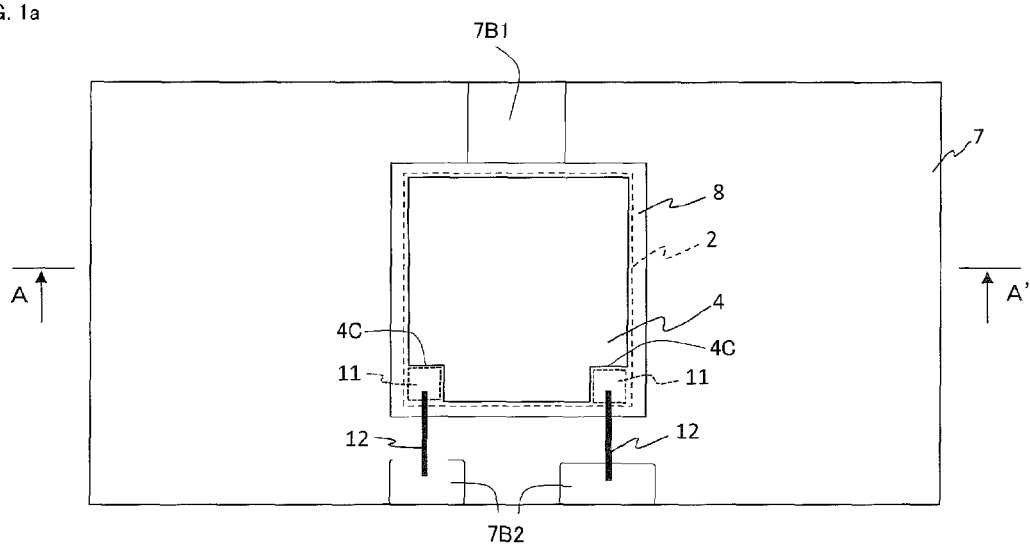
FIG. 1a is an enlarged top view showing a first exemplary embodiment of a semiconductor light-emitting device made in accordance with principles of the disclosed subject matter.
Figure 1B:
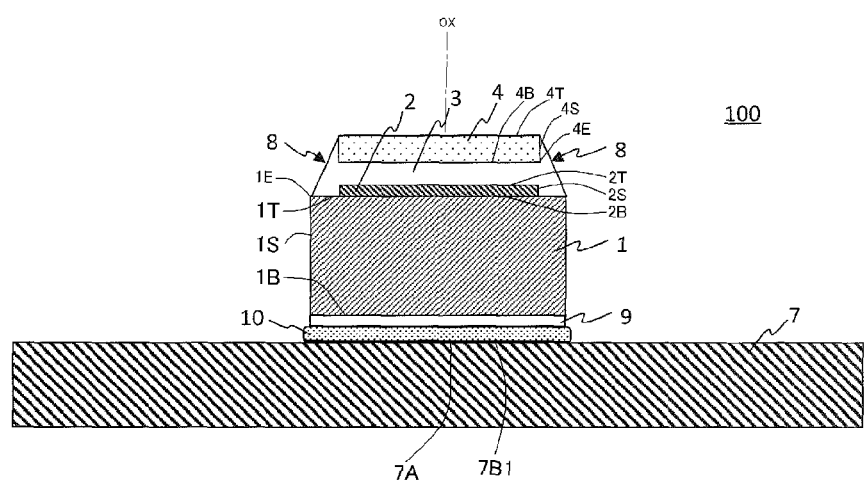

Exemplary embodiments and manufacturing methods of the disclosed subject matter will now be described in detail with reference to FIG. 1a to FIG. 5. FIG. 1a is an enlarged top view showing a first exemplary embodiment of a semiconductor light-emitting device made in accordance with principles of the disclosed subject matter, and FIG. 1b is an enlarged cross-sectional view showing the semiconductor light-emitting device taken along line A-A' shown in FIG. 1a.

The semiconductor light-emitting device 100 having an optical axis OX can include: a mounting board 7 having a mounting surface 7A, a first conductor pattern 7B1 and at least one second conductor pattern 7B2 formed on the mounting surface 7A; a semiconductor chip substrate 1 having a top surface 1T, a bottom surface 1B, a side surface 1S, a bottom electrode 9 formed underneath the bottom surface 1B and a substantially edge portion 1E located between the top surface 1T and the surface 1S, and the bottom electrode 9 mounted on the first conductor pattern 7B 1 of the mounting surface 7A of the mounting board 7 via a conductive adhesive layer 10 such as a conductive adhesive material, a conductive sheet, a conductive resin and the like; and a semiconductor epitaxial layer 2 having a top surface 2T, a bottom surface 2B and a side surface 2S including at least one top electrode 11, and formed on the top surface 1T of the semiconductor chip substrate 1, and the top surface 2T and the bottom surface 2B thereof being slightly smaller than the top surface 1T of the semiconductor chip substrate 2, wherein the optical axis of the semiconductor light-emitting device 100 intersects with a substantially center on the top surface of the semiconductor epitaxial layer 2 at a right angle.

In addition, the semiconductor light-emitting device 100 can also include a transparent resin layer 3 having a side surface 8 disposed on each of the top surface 1T of the semiconductor chip substrate 1 and the top surface 2T of the semiconductor epitaxial layer 2 so as to cover the semiconductor epitaxial layer 2 therewith, and a wavelength converting layer 4 having a top surface 4T, a bottom surface 4B, a side surface 4S and at least one cutout section 4C being formed in a substantially tabular shape having a substantially uniform thickness, and located over the top surface 2T of the semiconductor epitaxial layer 2, and the top surface 4T and the bottom surface 4B thereof being slightly smaller than the top surface 2T of the semiconductor epitaxial layer 2.

Accordingly, the side surface 8 of the transparent resin layer 3 can be connected between the side surface 4S of the wavelength converting layer 4 and the substantially edge portion 1E located between the top surface 1T and the side surface 1S of the semiconductor chip substrate 1, while the transparent resin layer 3 covers at least the edge portion 4E located between the side surface 4S and the bottom surface 4B of the wavelength converting layer 4. Therefore, the side surface 8 of the transparent resin layer 3 can extend from the side surface 4S of the wavelength converting layer 4 toward the substantially edge portion 1E of the semiconductor chip substrate 1, and also can incline from the side surface 4S of the wavelength converting layer 4 toward the substantially edge portion 1E in a linear fashion.

In this case, an angle $\theta$ of the side surface 8 with respect to the optical axis (a line parallel to the optical axis in FIG. 2) can be formed in at least acute angle, such as 45 degrees, 30 degrees, 15 degrees, etc. Thereby, because an amount of light 23, which reflects toward the wavelength converting layer 4, can increase, optical characteristics of the semiconductor light-emitting device 100 can improve, as described later in detail.

Each of the top electrode 11 and the bottom electrode 9 can be located on the top surface 2T of the semiconductor epitaxial layer 2 and underneath the bottom surface 1B of the semiconductor chip substrate 1 to apply a voltage supply to the semiconductor epitaxial layer 2, respectively. The top electrode 11 can be electrically connected to the second conductor pattern 7B2 via a bonding wire 12. In this case, the bonding wire 12 can pass through the cutoff section 4C of the wavelength converting layer 4, according to a device structure such as a size of the wavelength converting layer 4, a location of the top electrode 11, a thickness of the transparent resin layer 3 disposed between the bottom surface 4B of the wavelength converting layer 4 and the top surface 2T of the semiconductor epitaxial layer 2, etc.

The bottom electrode 9 can be electrically connected to the first conductor pattern 7B1, which is mounted on the mounting surface 7A of the mounting board 7, via the conductive adhesive layer 10. Accordingly, the semiconductor epitaxial layer 2 can emit light by providing between the first and the second conductor patterns 7B1 and 7B2, which extend toward a respective one of both sides of the mounting board 7, with a voltage supply from the both sides of the mounting board 7.

Each specific of the above-described elements will now be described in detail. As the semiconductor chip substrate 1, a substrate made from materials such that may not basically transmit light emitted from the semiconductor epitaxial layer 2, a reflective substrate and especially a single crystal reflective substrate such as a single crystal wafer, a single crystal germanium, a single crystal silicon and the like can be used, and also a silicon series material such as a silicon wafer, silicon carbide wafer and the like, a germanium series material such as a germanium wafer, and the like can be used. Thereby, because light emitted from the semiconductor epitaxial layer 2 cannot basically be emitted from the side surface 1S of the semiconductor chip substrate 1 and can be reflected on the top surface 1T of the semiconductor chip substrate 1, which is a substrate to form a fine semiconductor light-emitting device, the disclosed subject matter can provide semiconductor light-emitting devices having a small light-emitting surface, which is equal to a point light source.

As the semiconductor epitaxial layer 2, epitaxial layers emitting blue light such as GaN series, InGaN series and the like can be used. In addition, epitaxial layers of InGaN series emitting near-ultraviolet light having a wavelength of approximately 380 nanometers, a laser diode emitting ultraviolet light and the like can also be used as the semiconductor epitaxial layer 2. By using the above-described semiconductor epitaxial layer 2, the semiconductor light-emitting device 100 can emit various colored lights having a longer peak wavelength than the ultraviolet light having an approximately peak wavelength of 360 nanometers by wavelength-converting a part of light emitted from the semiconductor epitaxial layer 2 via the wavelength converting layer 4.

As the transparent resin layer 3, transparent resins such a silicone resin, an epoxy resin, an urethane resin and the like can be used to efficiently transmit the emitted from the semiconductor epitaxial layer 2 toward the wavelength converting layer 4. Additionally, inorganic compounds can also be used as the transparent resin layer 3 in place of the transparent resins, if they may be solidified after applying them on the top surfaces 1T and 2T of the semiconductor chip substrate 1 and the semiconductor epitaxial layer 2.

When the semiconductor light-emitting device 100 emits a mixture light including a large amount of light emitted from the semiconductor epitaxial layer 2, the thickness of the transparent resin layer 3 disposed between the bottom surface 4B of the wavelength converting layer 4 and the top surface 2T of the semiconductor epitaxial layer 2 may become thin. When the semiconductor light-emitting device 100 reduces a dependency of light-emitting angle with respect to a light-emitting color tone, the thickness of the transparent resin layer 3 disposed between the bottom surface 4B of the wavelength converting layer 4 and the top surface 2T of the semiconductor epitaxial layer 2 may become thicker. Hence, depending on a predetermined color tone, a light-emitting intensity and the like, the thickness of the transparent resin layer 3 disposed between the bottom surface 4B of the wavelength converting layer 4 and the top surface 2T of the semiconductor epitaxial layer 2 can be appropriately varied.

As the wavelength converting layer 4, a phosphor film formed in a sheeted shape, which is made by dispersing a phosphor in a transparent resin, a phosphor plate formed in a tabular shape, which is made by dispersing a phosphor in a transparent resin, and the like can be used. A phosphor plate, which is made by sintering a phosphor or by sintering a mixture of a phosphor and an inorganic compound, can also be used as the wavelength converting layer 4. In addition, a phosphor plate composed of a phosphor glass can also be used.

The above-described phosphor film and the various phosphor plates can be disposed on an uncured transparent resin using a mounter and the like, as described later in regard to a manufacturing method for the semiconductor light-emitting device 100. A kind of phosphor, a particle size of the phosphor, a density of the phosphor contained in the wavelength converting material 4 and the thickness of the wavelength converting material 4 can be prescribed in accordance with a light-emitting wavelength and a light-emitting intensity of light emitted from the semiconductor epitaxial layer 2 so that the semiconductor light-emitting device 100 can emit a mixture light having a predetermined color tone and a light-emitting intensity.

With respect to the phosphor, when the semiconductor epitaxial layer 2 emits blue light having a peak wavelength of 460 nanometers, the wavelength converting layer 4 can include a phosphor to convert light emitted from the semiconductor epitaxial layer 2 into a particular wavelength or range of wavelengths of light. The phosphor can be excited by the light emitted from the semiconductor epitaxial layer 2, and can emit a wavelength-converted light. Accordingly, the semiconductor light-emitting device 100 can emit a mixture light having a different light-emitting wavelength from that of the semiconductor epitaxial layer 2 by an additive color mixture of a part of the light emitted from the semiconductor epitaxial layer 2 and the wavelength-converted light excited by another part of the light.

When the semiconductor epitaxial layer 2 emits the blue light having a peak wavelength of 460 nanometers, the yellow phosphor can emit a yellow light upon being excited by the blue light emitted from the semiconductor epitaxial layer 2. Accordingly, the semiconductor light-emitting device 100 can emit a substantially white light by an additive color mixture of the excited yellow light emitted from the yellow phosphor and a part of the blue light emitted from the semiconductor epitaxial layer 2. The wavelength converting layer 4 can also include a wavelength converting resin that is made by mixing a yellow phosphor with a transparent resin such as a silicone resin and the like.

As the yellow phosphor, YAG (Yttrium aluminum garnet), TAG (Terbium aluminum garnet), Sialon (Silicon aluminum oxygen nitrogen), BOS (Barium ortho silicate) and the like can be used for the wavelength converting layer 4. A yellow phosphor plate formed in a tabular shape, for example, can be made by sintering YAG, by sitering YAG and $AL_2O_3$, etc. In place of the yellow phosphor, a mixed phosphor of a red phosphor wavelength-converting the blue light into red-purple light and a green phosphor wavelength-converting the blue light into blue-green light can also be used. In this case, the semiconductor light-emitting device 100 can provide white light having a high color rendering property and a broad emission spectrum by an additive color mixture of the red-purple light emitted from the red phosphor that is excited by the blue light, the blue-green light emitted from the green phosphor that is excited by the blue light and a part of the blue light.

The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6$ $(O, N)$: $Eu^{2+}$ and the like can be used as the green phosphor. When the semiconductor light-emitting device 100 includes a semiconductor epitaxial layer 2 of InGaN series that emits near-ultraviolet light having a wavelength of approximately 380 nanometers, a laser diode that emits ultraviolet light, and the like, the at least one phosphor can include: a red phosphor wavelength-converting the ultraviolet light into red light; a green phosphor wavelength-converting the ultraviolet light into green light; and a blue phosphor wavelength-converting the ultraviolet light into blue light, in order to emit a substantially white light.

In this case, $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si, Al)_6 (O, N)$: $Eu^{2+}$, $BaMgAl_{10}O_{17}$: $Eu^{2+}$ $Mn^{2+}$, $(Ba, Sr)_2SiO_4$: $Eu^{2+}$ and the like can be used as the green phosphor. $(Sr, Ca, Ba, Mg)_{10}(PO_4)_6Cl_2$: $Eu^{2+}$, $BaMgAl_{10}O_{17}$: $Eu^{2+}$, $LaAl(Si, Al)_6 (N, O)_{10}$: $Ce^{3+}$ and the like can be used as the blue phosphor. Therefore, the semiconductor light-emitting device 100 of the disclosed subject matter can also emit various colored lights by adjusting each density of the red phosphor, the green phosphor and the blue phosphor contained in the wavelength converting layer 4 using each of the ultraviolet lights emitted from the semiconductor epitaxial layers 2.

The mounting board 7 can be composed of a ceramic substrate, a metallic substrate such as an Aluminum nitride substrate having a high thermal conductivity, a glass epoxy board and the like. Each of the first conductor pattern 7B1 and the second conductor pattern 7B2 can be made from Au (gold) and the like, and can be formed on the mounting surface 7A of the mounting board 7 to mount the semiconductor chip substrate 1 and to receive a power supply for the semiconductor epitaxial layer 2 via the top electrode 11 and the bottom electrode 9. The transparent material layer 3 can be formed of a transparent resin such as a silicone resin, an epoxy resin, etc.

Behaviors of light emitted from the semiconductor light-emitting device 100 will now be described in detail with reference to FIG. 2. The semiconductor epitaxial layer 2 can emit light (e.g., blue light) from the side surface 2S and the top surface 2T thereof toward the transparent resin layer 3, because the semiconductor chip substrate 1 is configured not to transmit the light emitted from the semiconductor epitaxial layer 2. Blue lights 21, which are emitted in a direction toward the bottom surface 4B of the wavelength converting layer 4 including a phosphor (e.g., yellow phosphor) from the semiconductor epitaxial layer 2, can enter into the wavelength converting layer 4 via the transparent resin layer 3, and a part of the blue lights 21 may be absorbed by the yellow phosphor.

Accordingly, the part of the blue lights 21, which is absorbed by the yellow phosphor, can become wavelength-converted yellow lights 31 and 32 because of being excited. The yellow light 31, which moves in an upward direction of the wavelength converting layer 4, can be mixed with another part of the blue lights 21, which is directly emitted from the semiconductor epitaxial layer 2 and is not absorbed by the yellow phosphor, and therefore can become substantially white light due to the additive color mixture. As a result, the substantially white light can be emitted from the top surface 4T of the wavelength converting layer 4, which is a light-emitting surface of the semiconductor light-emitting device 100.

The yellow light 32, which moves in an oblique direction with respect to the wavelength converting layer 4, can move in the wavelength converting layer while repeating reflections between the top surface 4T and the bottom surface 4B of the wavelength converting layer 4 including the yellow phosphor. Thereby, the semiconductor light-emitting device 100 can emit substantially white light from the top surface 4T of the wavelength converting layer 4 by an additive color mixture of the excited yellow light wavelength-converted by the yellow phosphor and a direct light of the blue lights 21 emitted from the semiconductor epitaxial layer.

In these cases, the thickness between the top surface 4T and the bottom surface 4B of the wavelength converting layer 4 may be substantially uniform between the opposite side surfaces 4S, and each amount of the wavelength-converted yellow lights 31 and 32 may be substantially same in a direction of the optical axis OX shown in FIG. 1b. Therefore, the semiconductor light-emitting device 100 can emit various mixture lights having a substantially uniformity by a mixture light of excited lights wavelength-converted by the above-described phosphors and original lights emitted from the various semiconductor epitaxial layers 2 as described above.

Figure 2:
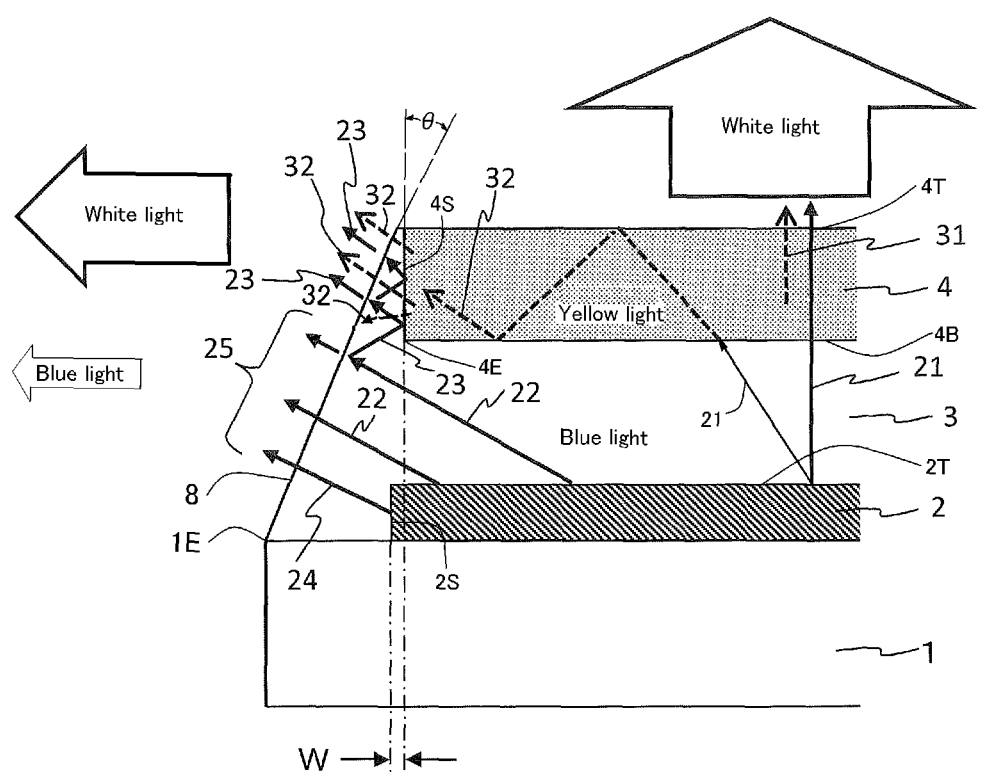
FIG. 2 is an explanatory view depicting a partial enlarged cross-sectional view of the semiconductor light-emitting device shown in FIG. 1b to explain various light paths in the semiconductor light-emitting device.

On the other hand, blue lights 22, which are emitted from the top surface 2T of the semiconductor epitaxial layer 2 in a downward direction from the edge portion 4E of the wavelength converting layer 4, and a weak blue light 24, which is leaked from the side surface 2S of the semiconductor epitaxial layer 2 toward the side surface 8 of the transparent resin layer 3, may get to the side surface 8 via the transparent resin layer 3, and a slight part of the blue lights 22 and 24 may be emitted in an outside direction of the side surface 8 of the transparent resin layer 3 as light 25 shown in FIG. 2.

However, another part of the blue lights 22 and 24 may be reflected on the side surface 8 of the transparent resin layer 3, which inclines from the side surface 4S of the wavelength converting layer 4 toward the substantially edge portion 1E in a linear fashion, may get to the side surface 4S of the wavelength converting layer 4, and may be mostly reflected on the side surface 4S as blue light 23. A part of the blue light 23 may be emitted in the outside direction of the side surface 8 of the transparent resin layer 3 while repeating reflections between the side surface 4S of the wavelength converting layer 4 and the side surface 8 of the transparent resin layer 3.

In this case, the blue light 23 can be mixed with substantially white light including a comparative large amount of the yellow light 32, which is emitted from the side surface 4S of the wavelength converting layer 4 via long path lengths, and can be emitted after becoming a mixture light having a substantially same color tone as the white light emitted from the top surface 4T of the wavelength converting layer 4. In addition, a part of the blue light 25 can also be mixed with substantially white light including the comparative large amount of the yellow light 32, in totality including both inside and outside of the transparent resin layer 3, and can be emitted after becoming a mixture light having a substantially same color tone as the white light emitted from the top surface 4T of the wavelength converting layer 4.

Thus, the semiconductor light-emitting device 100 of the disclosed subject matter can emit the mixture light having the substantially same color tone from the top surface 4T of the wavelength converting layer 4 and an upper portion of the side surface 8 of the transparent resin layer 3, and therefore can reduce even a color variability, which depends on a light-emitting angle with respect to the optical axis OX thereof, as compared with a structure of a semiconductor light-emitting device, which does not cover the edge portion 4E of the wavelength converting layer 4 with the transparent resin layer 3.

Furthermore, a size of the wavelength converting layer 4 can be equaled to that of the semiconductor epitaxial layer 2 so that a difference W can be equal to Zero (W=0), and also can be minified than that of the semiconductor epitaxial layer 2 so that the difference W can be more than Zero (W>0) as shown in FIG. 2. Thereby, the whole bottom surface 4B of the wavelength converting layer 4 can face the top surface 2T of semiconductor epitaxial layer 2. Therefore, because a ratio of an amount of light emitted from the semiconductor epitaxial layer 2 along the optical axis OX of the semiconductor light-emitting device 100 and the thickness of the wavelength converting layer 4 in the direction of the optical axis OX shown in FIG. 1b can be basically equalized, each of color variabilities in top views from the top surface 4T of the wavelength converting layer 4 along the optical axis OX can reduce with respect to each other.

Figure 3:
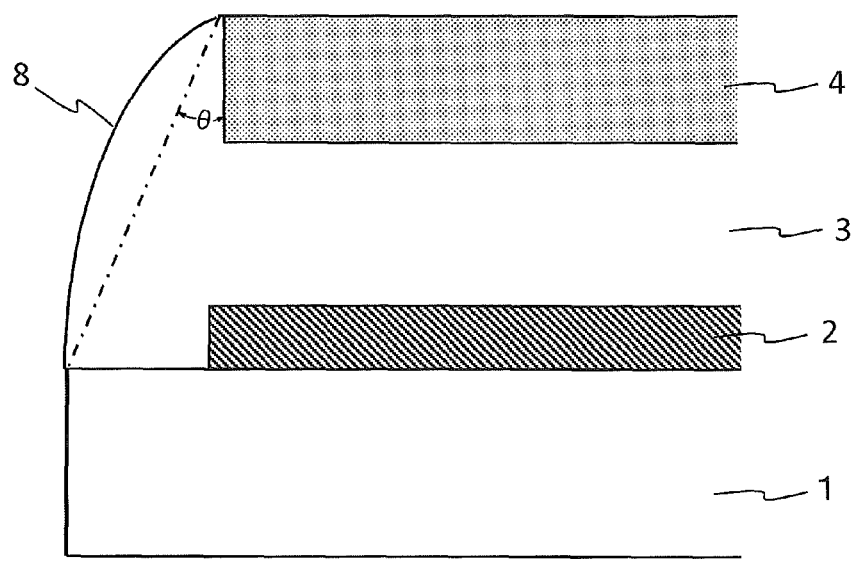
FIG. 3 is an explanatory view depicting an exemplary variation of a side surface of a transparent resin layer for the semiconductor light-emitting device shown in FIG. 1b.

FIG. 3 is an explanatory view depicting an exemplary variation of the side surface 8 of the transparent resin layer 3 for the semiconductor light-emitting device 100. The side surface 8 can be formed in a convex shape in an opposite direction of the semiconductor epitaxial layer 2. In this case, an amount of lights, which are total-reflected on the side surface 8 of the transparent resin layer 3 in the original lights emitted from the semiconductor epitaxial layer 2, can reduce as compared with the side surface 8 of the transparent resin layer, which is formed in a convex shape in a direction toward the semiconductor epitaxial layer 2. Each angle θ of linear lines connecting both ends of the side surface 8, which intersects with the optical axis OX, with respect to the optical axis (a line parallel to the optical axis OX in FIG. 3) can be formed in at least acute angle, such as 45 degrees, 30 degrees, 15 degrees and the like toward the wavelength converting layer 4 due to the same reason as that of a structure shown in FIG. 2.

In addition, even if a part of the lights emitted from the semiconductor epitaxial layer 2 reflects, said reflected light can tend to move toward the wavelength converting layer 4 rather than the semiconductor chip substrate 1. Accordingly, the side surface 8, which is formed in a convex shape in the opposite direction of the semiconductor epitaxial layer as shown in FIG. 3, can result in an improvement of a light-emitting efficiency of the semiconductor light-emitting device 100.

A manufacturing method for the above-described semiconductor light-emitting device will now be described in detail with reference to FIG. 4a to FIG. 4d. FIGS. 4a and 4d are explanatory views showing an exemplary manufacturing method for the semiconductor light-emitting device shown in FIGS. 1a and 1b, in which FIGS. 4a, 4c and 4d are side views and FIG. 4b is a top view.

Process (a) is preparing the mounting board 7 having the first conductor pattern 7B1 and the second conductor pattern 7B2 formed on the mounting surface 7A thereof, and the semiconductor chip substrate 1 forming the semiconductor epitaxial layer 2 thereon, and mounting the semiconductor chip substarate 1 on the first conductor pattern 7B1 of the mounting board 1 via the conductive adhesive layer 10, as shown in FIG. 4a. When the semiconductor chip substrate 1 is composed of a conductive silicon series substrate or a conductive germanium series substrate and when the semiconductor epitaxial layer 2 is a metallic bonding chip (MB chip), the conductive adhesive layer 10 can be formed from AuSn paste.

Thereby, while the bottom electrode 9 of the semiconductor chip substrate 1 can be electrically connected to the first conductor pattern 7B 1 of the mounting board 7 via the conductive adhesive layer 10, the semiconductor chip substrate 1 including the semiconductor epitaxial layer 2 can be mounted on the mounting surface 7A of the mounting board 7 in confidence via the conductive adhesive layer 10 at once.

Process (b) is wire-bonding between the top electrode 11 of the semiconductor epitaxial layer 2 and the second conductor pattern 7B2 of the mounting board 7 via the bonding wire 12 (e.g., Au wire). Hence, each of the first conductor pattern 7B1 and the second conductor pattern 7B2 can be used as both electrodes of the semiconductor light-emitting device 100 to provide the semiconductor epitaxial layer 2 with a power supply, as shown in FIG. 4b.

Process (c) is disposing an uncured transparent resin 30 such as a silicon resin on the top surfaces 1T and 2T of the semiconductor chip substrate 1 and the semiconductor epitaxial layer 2 using a dispenser 61 and the like, as shown in FIG. 4c. In this case, an amount of the uncured transparent resin 30 can be adjusted in accordance with the thickness of the wavelength converting layer 4, which is disposed between the bottom surface 4B of the wavelength converting layer 4 and the top surface 2T of the semiconductor epitaxial layer 2. When the side surface 8 of the transparent resin layer 3 is formed in the convex shape as shown in FIG. 3, the surface 8 can be formed by increasing the amount of the uncured transparent resin 30 than that of the surface 8 formed in the substantially linear shape as shown in FIG. 1b.

Process (d) is mounting the wavelength converting layer 4 on the uncured transparent resin 30 using a glass mounter 62 and the like, while the wavelength converting layer 4 is floated by using a surface tension of the uncured transparent resin 30 so that a center the wavelength converting layer 4 basically corresponds to the optical axis OX, which passes through the substantially center of the semiconductor epitaxial layer 2 at a right angle with respect to the top surface 2T, using a substantially uniform surface tension between the side surface 4S having substantially four similar thin surfaces of the wavelength converting layer 4 and the uncured transparent resin 30.

In this case, a positional accuracy can also improve by mounting the wavelength converting layer 4 using an image recognition technology, in which at least one camera images a positional relation between the semiconductor epitaxial layer 2 and the wavelength converting layer 4 in at least one direction from the top surface 4T and the side surface 4S of the wavelength converting layer 4 and the glass mounter 62 is controlled so that the positional relation between the semiconductor epitaxial layer 2 and the wavelength converting layer 4 can maintain at a prescribed positional relation.

The uncured transparent resin 30 can cover underneath the bottom surface 4B of the wavelength converting layer 4, and can form a inclined side surface between the side surface 4S of the wavelength converting layer 4 and the substantially edge 1T of the semiconductor chip substrate 1 using the surface tension of the uncured transparent resin 30, which behaves between the wavelength converting layer 4 and the semiconductor chip substrate 1, as shown in FIG. 4d. In this case, the wavelength converting layer 4 can be positioned by pushing the wavelength converting layer 4 toward the uncured transparent resin 30 using the glass mounter 62, when the uncured transparent resin 30 is not dragged on the side surface 4S of the wavelength converting layer 4 because the wavelength converting layer is light and/or the viscosity of the uncured transparent resin 30 is high.

After finishing said positioning of the wavelength converting layer 4, a shape of the uncured transparent resin 30 may be kept by semi-solidifying it using a heating process, etc. When the uncured transparent resin 30 is a silicone resin, the uncured transparent resin 30 may be semi-solidified by heating it for two hours to four hours under 150 degrees centigrade, and also may be semi-solidified by heating it for approximately 15 to 30 minutes only if a semi-solidified transparent resin keeps the shape thereof. Additionally, without keeping said semi-solidified state, the uncured transparent resin 30 can also be completely solidified by heating it for approximately two hours to four hours under 150 degrees centigrade.

As described above, the manufacturing method can easily form the transparent resin layer 3 having the side surface 8, which inclines between the side surface 4S of the wavelength converting layer 4 and the edge 1T of the semiconductor chip substrate 1 by using the surface tension of the uncured transparent resin 30, which behaves between the wavelength converting layer 4 and the semiconductor chip substrate 1, by mounting the wavelength converting layer 4, which is the substantially same size as the semiconductor epitaxial layer 2 or which is slightly smaller than the semiconductor epitaxial layer 2, on the uncured transparent resin 30. Accordingly, the manufacturing method can encapsulate the fine semiconductor epitaxial layer 2 with the transparent resin layer 3 having the side surface 8, which is formed in a prescribed inclined shape, without a molding tool, etc.

In addition, the thickness between the top surface 4T and the bottom surface 4B of the wavelength converting layer 4 can be substantially uniform, and also the whole wavelength converting layer 4 can face the semiconductor epitaxial layer 2. Therefore, because the ratio of the amount of the light emitted from the semiconductor epitaxial layer 2 along the optical axis OX of the semiconductor light-emitting device 100 and the thickness of the wavelength converting layer 4 in the direction of the optical axis OX can be substantially equalized, each of the color variabilities in views from the top surface 4T of the wavelength converting layer 4 along the optical axis OX can reduce.

Moreover, the blue light, which tends to be emitted from the upper portion of the side surface 8 of the transparent resin layer 3, can be mixed with the substantially white light including the comparative large amount of the yellow light, which is emitted from the side surface 4S of the wavelength converting layer 2 including the yellow phosphor via the long path lengths, and can be emitted after becoming the mixture light having the substantially same color tone as the mixture light emitted from the top surface 4T of the wavelength converting layer 4.

In addition, most of the weak leaked blue light, which may be emitted from the lower portion of the side surface 8 of the transparent resin 3, can also be mixed with the substantially white light including the comparative large amount of the yellow light, in totality including both inside and outside of the transparent resin layer 3, and can be emitted after becoming the mixture light having the similar color tone to the mixture light emitted from the upper portion of the side surface 8 of the transparent resin layer 3.

Thus, the semiconductor light-emitting device 100 of the disclosed subject matter can emit the mixture light having the substantially uniform color tone from the top surface 4T of the wavelength converting layer 4 and the side surface 8 of the transparent resin layer 3, and therefore can reduce even a color variability, which depends on a light-emitting angle with respect to the optical axis OX thereof, by covering the side surface 4S including the edge portion 4E of the wavelength converting layer 4 with the transparent resin layer 3. Accordingly, even when the semiconductor light-emitting device 100 is used as a light source for a lighting unit such as a vehicle headlight such that enlarges light emitted from the semiconductor light-emitting device 100 using a reflector and/or a projector lens, the disclosed subject matter can provide various expensive-looking lighting units having the substantially uniform color tone using the reflector and/or the projector lens.

Furthermore, the semiconductor light-emitting device 100 can emit various colored lights only from the top surface 4T of the wavelength converting layer 4 and the side surface 8 of the transparent resin layer 3, which is located over the top surface 1T of the semiconductor chip substrate 1, in a substantially upward direction of the semiconductor light-emitting device 100. Therefore, the disclosed subject matter can provide various semiconductor light-emitting devices that can the mixture light having a substantially uniform color tone, a high light-emitting density and a high contrast, which is sharp at a boundary between a non-light-emitting surface and a light-emitting surface from a very small light-emitting surface. Thus, the semiconductor light-emitting devices can easily enable to provide the various expensive-looking lighting units having a favorable light-emitting distribution using the reflector and/or the projector lens.

Figure 5:
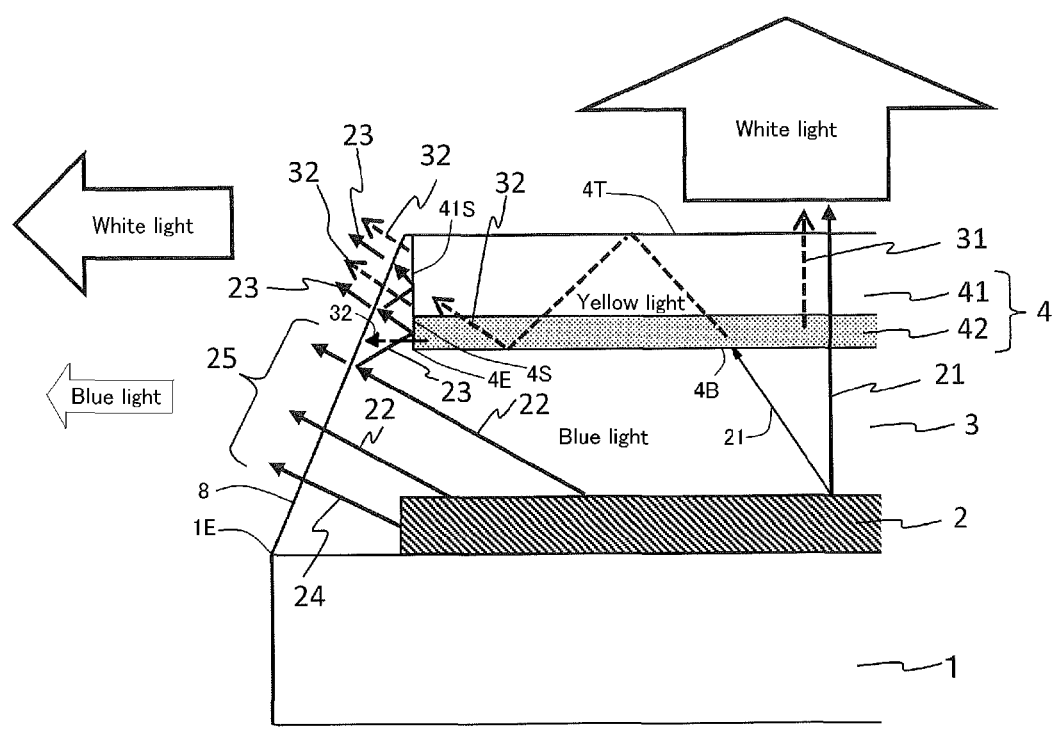
FIG. 5 is an explanatory view depicting a partial enlarged cross-sectional view of a second exemplary embodiment of the semiconductor light-emitting device made in accordance with principles of the disclosed subject matter to explain various light paths in the second embodiment.
Figure 6:
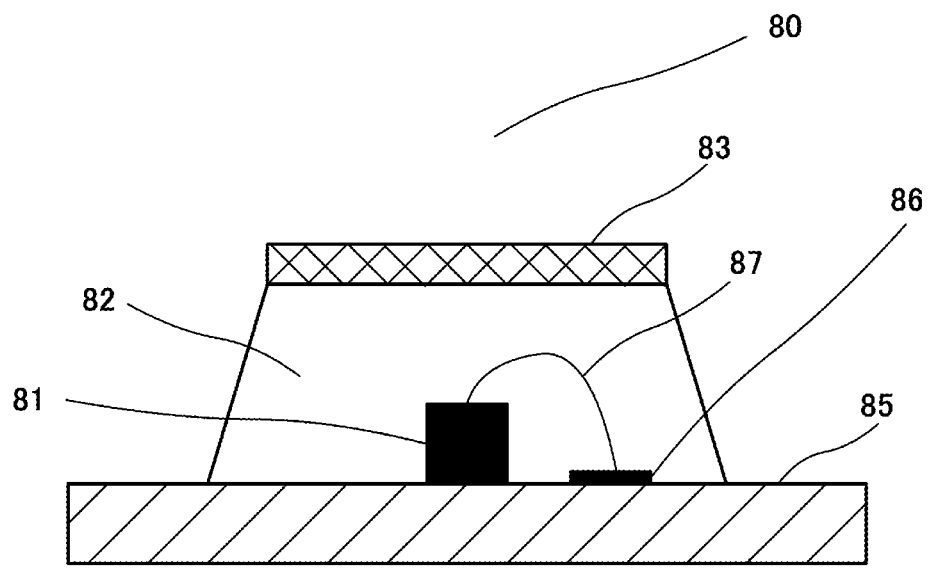
FIG. 6 is an enlarged cross-sectional view showing a first conventional semiconductor light-emitting device.
Figure 7A:
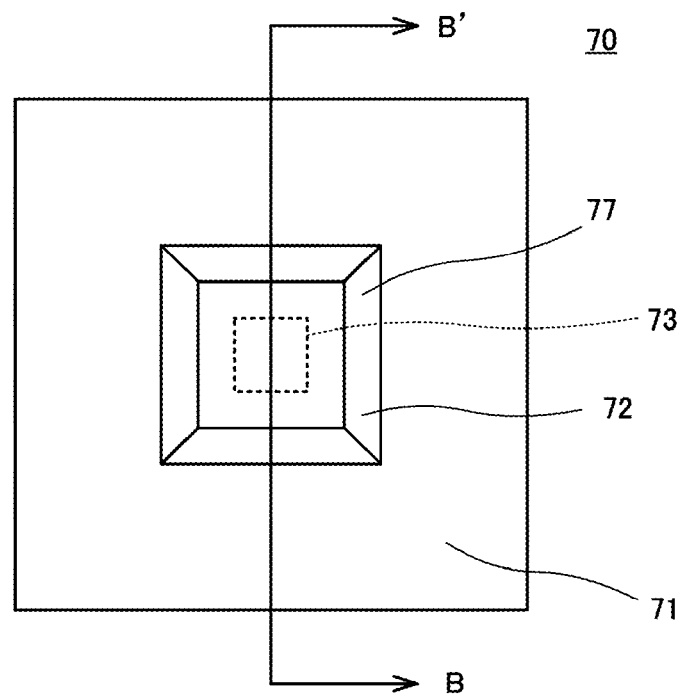
FIG. 7a is an enlarged top view showing a second conventional semiconductor light-emitting device.
Figure 7B:
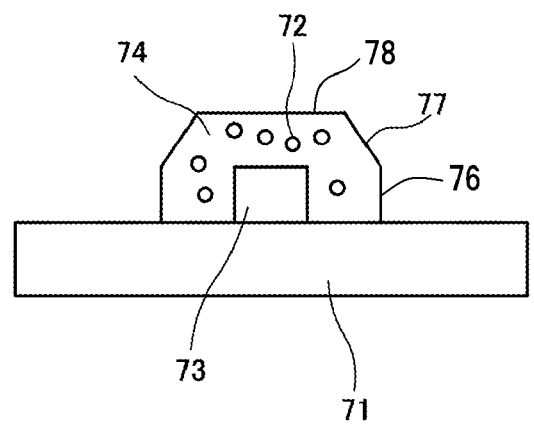
Figure 8A:
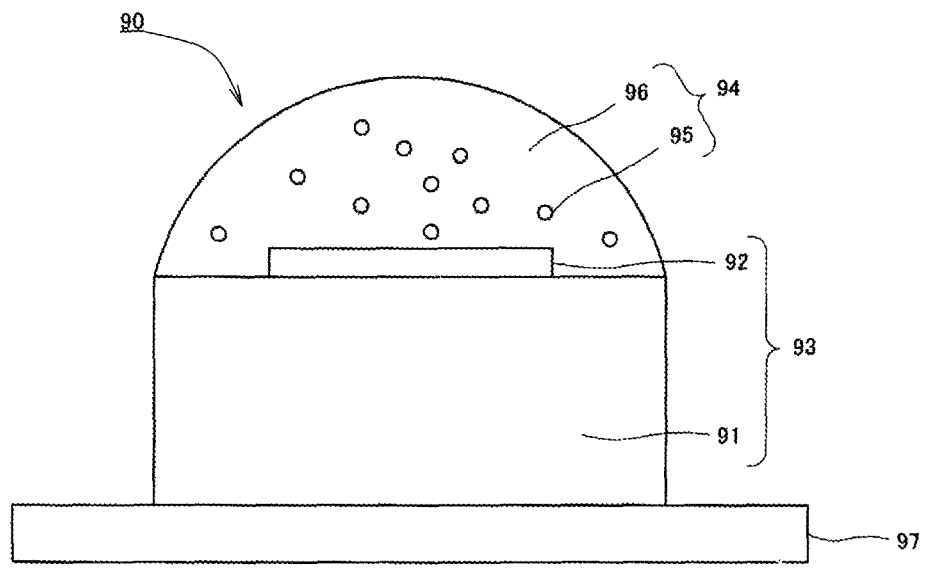
FIG. 8a is an enlarged cross-sectional view showing a third conventional semiconductor light-emitting device.
Figure 8B:
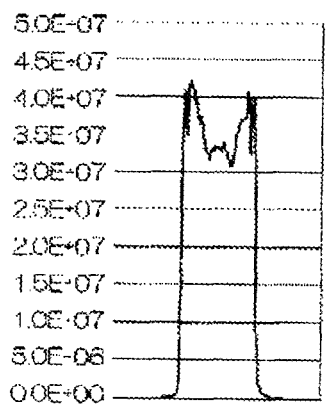

Second exemplary embodiments will now be described with reference to FIG. 5. FIG. 5 is an explanatory view depicting a partial enlarged cross-sectional view of a second exemplary embodiment of the semiconductor light-emitting device made in accordance with principles of the disclosed subject matter to explain various light paths in the second embodiment. A difference between the second embodiment and the first embodiment relates to a wavelength converting layer 4.

The wavelength converting layer 4 of the second embodiment can be composed of a transparent plate 41, which is formed in a substantially uniform tabular shape, and a wavelength converting resin 42 including a phosphor, which is disposed underneath the transparent plate 41 as shown in FIG. 5. Other structures are the basically same as the first embodiment. Hence, the wavelength converting resin 42 of the wavelength converting layer 4 can be located between the transparent resin layer 3 and the transparent plate 41, which can transmit the original light emitted from the semiconductor epitaxial layer 2 and a wavelength-converted light by the wavelength converting resin 42 including the phosphor.

The transparent plate 41 can be made of a quartz, a alkali-free glass, a low alkaline glass and a transparent resin such as an epoxy resin, etc. In the wavelength converting layer 4, the wavelength converting resin 42 cannot be necessarily formed in a film shape, a plate shape and the like by itself to facilitate the mounting process of the wavelength converting layer 4 due to the transparent plate 41, as shown in FIG. 4d. Consequently, the wavelength converting resin 42 can be naturally formed in a film shape or a plate shape by using the transparent plate 41.

In this case, the wavelength converting layer 4 of the second embodiment can be formed by applying the wavelength converting resin 42 including a phosphor on one surface of the transparent plate 41, and also can be formed by spraying a mixture resin, which mixes an inorganic binder and a phosphor with a transparent resin such as a silicone resin and the like, on the one surface of the transparent plate 41 as the wavelength converting layer 4. Therefore, the semiconductor light-emitting device of the second embodiment can also be manufactured by the above-described manufacturing method for the semiconductor light-emitting device 100 of the first embodiment in the same way.

In the above-described second embodiment, a part of the yellow light 32 wavelength-converted by the wavelength converting layer 4 may not only move in the wavelength converting resin 42 but also may move in the transparent plate 41, because a refractive index of the transparent plate 41 of the wavelength converting layer 4 may be generally higher than that of air.

The semiconductor light-emitting device of the second embodiment can also include the transparent resin layer 3 having the side surface 8 disposed on each of the top surface 1T of the semiconductor chip substrate 1 and the top surface 2T of the semiconductor epitaxial layer 2 so as to cover the semiconductor epitaxial layer 2 therewith, and the side surface 8 of the transparent resin layer 3 can be connected between a side surface 41S of the transparent plate 41 of the wavelength converting layer 4 and the substantially edge portion 1E located between the top surface 1T and the side surface 1S of the semiconductor chip substrate 1, while the transparent resin layer 3 covers the edge portion 4E located between the side surface 4S and the bottom surface 4B of the wavelength converting layer 4.

Thereby, the yellow light 32, which moves in an oblique direction with respect to the wavelength converting layer 4, can move in the wavelength converting layer 4 including the transparent plate 41 while repeating reflections between the top surface 4T and the bottom surface 4B of the wavelength converting layer 4 including the yellow phosphor. In this case, the wavelength converting resin 42 may be formed in a substantially uniform thickness underneath the transparent plate 41, and an amount of the wavelength-converted yellow lights 32 may be substantially same in a direction of the optical axis OX shown in FIG. 1b. Therefore, the semiconductor light-emitting device can also emit various mixture lights having a substantially uniform color tone by using a mixture light of the light wavelength-converted by the wavelength converting layer 42 and the original light emitted from the semiconductor epitaxial layer 2.

Blue lights 22, which are emitted from the top surface 2T of the semiconductor epitaxial layer 2 in a downward direction from the substantially edge portion 4E of the wavelength converting layer 4, and a weak blue light 24 such that is leaked from the side surface 2S of the semiconductor epitaxial layer 2 toward the side surface 8 of the transparent resin layer 3, may get to the side surface 8 via the transparent resin layer 3, and a slight part of the blue lights 22 and 24 may be emitted in an outside direction of the side surface 8 of the transparent resin layer 3 as light 25 shown in FIG. 5.

However, another part of the blue lights 22 and 24 may be reflected on the side surface 8 of the transparent resin layer 3, which inclines from the side surface 41S of the wavelength converting resin 41 toward the substantially edge portion 1E in a linear fashion, may get to the side surface 4S including the side surface 41S of the wavelength converting layer 4, and may be mostly reflected on the side surface 4S as blue light 23. A part of the blue light 23 may be emitted in the outside direction of the side surface 8 of the transparent resin layer 3 while repeating reflections between the side surface 4S of the wavelength converting layer 4 and the side surface 8 of the transparent resin layer 3.

In this case, the blue light 23 can be mixed with substantially white light including a comparative large amount of the yellow light 32, which is emitted from the side surface 4S of the wavelength converting layer 4 via long path lengths, and therefore can be emitted after becoming a mixture light having a substantially same color tone as the white light emitted from the top surface 4T of the wavelength converting layer 4. In addition, a part of the blue light 25 can also be mixed with substantially white light including the comparative large amount of the yellow light 32, in totality including both inside and outside of the transparent resin layer 3, and therefore can be emitted after becoming a mixture light having a substantially same color tone as the white light emitted from the top surface 4T of the wavelength converting layer 4.

Thus, the semiconductor light-emitting device of the second embodiment can also emit the mixture light having the substantially same color tone from the top surface 4T of the wavelength converting layer 4 and an upper portion of the side surface 8 of the transparent resin layer 3, and therefore can reduce even a color variability, which depends on a light-emitting angle with respect to the optical axis OX thereof, in common with the structure of the first embodiment.

In addition, the side surface 8 of the transparent resin layer 3 of the second embodiment can also be formed in a convex shape in the opposite direction of the semiconductor epitaxial layer 2 as shown in FIG. 3. In this case, an amount of light, which is total-reflected on the side surface 8 of the transparent resin layer 3 in lights emitted from the semiconductor epitaxial layer 2, can reduce as compared with the side surface 8 formed in a convex shape in a direction toward the semiconductor epitaxial layer 2. Moreover, even if a part of the lights emitted from the semiconductor epitaxial layer 2 reflects, said reflected light can tend to move toward the wavelength converting layer 4 rather than the semiconductor chip substrate 1.

Accordingly, the side surface 8, which is formed in a convex shape in the outside direction of the device shown in FIG. 3, can result in an improvement of a light-emitting efficiency of the semiconductor light-emitting device of the second embodiment. As described above, the disclosed subject matter can provide semiconductor light emitting devices that can emit a mixture light from a small light-emitting surface, because the semiconductor chip substrate 1 is configured not to transmit the light emitted from the semiconductor epitaxial layer 2 and also can be used to form a small device.

Moreover, the semiconductor light-emitting devices can emit the mixture light having a substantially uniform color tone from the top surface 4T of the wavelength converting layer 4 because its thickness is the substantially uniform thickness, and also can emit a mixture light having the similar uniform color tone as described above from the side surface 8 of the transparent resin layer 3 by mixing light including a comparative large amount of light wavelength-converted emitted from the side surface 4S of the wavelength converting layer 4 due to a long path length with a weak direct light emitted from the semiconductor epitaxial layer 2 toward the side surface 8 of the transparent resin layer 3. Thus, the disclosed subject matter can provide semiconductor light-emitting devices that can emit a mixture light having a substantially uniform color tone from a small light-emitting surface.

Furthermore, the disclosed subject matter can provide semiconductor light-emitting deices that can various colored lights by combining the above-described semiconductor epitaxial layer 2 with the wavelength converting layer 4 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, it is contemplated that any different semiconductor epitaxial layer can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a mounting board having a mounting surface and a first conductor pattern and at least one second conductor pattern formed on the mounting surface;
   a semiconductor chip substrate having a bottom surface, a top surface, a side surface, a substantially edge portion located between the top surface and the side surface and a bottom electrode formed underneath the bottom surface, the semiconductor chip substrate mounted adjacent the mounting surface of the mounting board via a conductive adhesive layer, and thereby the bottom electrode of the semiconductor chip substrate being electrically connected to the first conductor pattern of the mounting board via the conductive adhesive layer;
   a semiconductor epitaxial layer having a top surface, a bottom surface, a substantially center located on the top surface, at least one top electrode formed on the top surface of the semiconductor epitaxial layer and an optical axis intersected with the substantially center of the top surface of the semiconductor epitaxial layer at a right angle, the semiconductor epitaxial layer mounted on the top surface of the semiconductor chip substrate, each of the top surface and the bottom surface of the semiconductor epitaxial layer being smaller than the top surface of the semiconductor chip substrate, each of the bottom surface of the semiconductor epitaxial layer and the top surface of the semiconductor chip substrate contacting with respect to each other, and the at least one top electrode being electrically connected to the at least one second conductor pattern of the mounting board;

a wavelength converting layer having a top surface, a side surface, a bottom surface and a substantially edge portion located between the side surface and the bottom surface, the wavelength converting layer including at least one phosphor, formed in a substantially uniform thickness between the top surface and the bottom surface of the wavelength converting layer, and located over the top surface of the semiconductor epitaxial layer, the bottom surface of the wavelength converting layer facing the top surface of the semiconductor epitaxial layer, and therefore being smaller than the top surface of the semiconductor epitaxial layer;

a transparent resin layer having a side surface disposed on the top surface of the semiconductor epitaxial layer and the top surface of the semiconductor chip substrate, and covering at least the substantially edge portion of the wavelength converting layer, the side surface of the transparent resin layer extending from the side surface of the wavelength converting layer to the substantially edge portion of the semiconductor chip substrate, and therefore inclining from the side surface of the wavelength converting layer toward the substantially edge portion of the semiconductor chip substrate; and wherein the semiconductor chip substrate is configured with a reflective substrate.

2. The semiconductor light-emitting device according to claim 1, wherein the side surface of the transparent resin layer is formed in at least one of a substantially linear shape and a convex shape in an opposite direction of the semiconductor epitaxial layer between the side surface of the wavelength converting layer and the substantially edge portion of the semiconductor chip substrate.

3. The semiconductor light-emitting device according to claim 1, wherein the semiconductor epitaxial layer is a metallic bonding chip emitting blue light and the at least one phosphor of the wavelength converting layer is selected from the group consisting of a yellow phosphor, and two phosphors including a red phosphor layer and a green phosphor layer.

4. The semiconductor light-emitting device according to claim 1, wherein the semiconductor epitaxial layer is a metallic bonding chip emitting an ultraviolet light and the at least one phosphor of the wavelength converting layer includes at least one of a red phosphor, a green phosphor, and a blue phosphor.

5. The semiconductor light-emitting device according to claim 1, wherein the wavelength converting layer includes at least one cutout section, and the at least one cutout section exposes the at least one top electrode of the semiconductor epitaxial layer from the semiconductor epitaxial layer in a top view of the wavelength converting layer in a direction perpendicular to the optical axis of the semiconductor epitaxial layer.

6. The semiconductor light-emitting device according to claim 1, wherein the wavelength converting layer is any one of a phosphor film formed in a sheeted shape, which is made by dispersing at least one phosphor in a transparent resin, a phosphor plate formed in a tabular shape, which is made by dispersing at least one phosphor in a transparent resin, a phosphor plate, which is made by sintering at least one phosphor, and a phosphor plate, which is composed of a phosphor glass.

7. The semiconductor light-emitting device according to claim 1, wherein the wavelength converting layer is composed of a transparent plate, which is formed in a substantially uniform tabular shape, and a wavelength converting resin including at least one phosphor, which is formed in a substantially uniform thickness underneath the transparent plate, and the side surface of the transparent resin layer extends from a part of the transparent plate on the side surface of the wavelength converting layer to the substantially edge portion of the semiconductor chip substrate while the transparent resin layer covers at least the substantially edge portion of the wavelength converting layer.

8. The semiconductor light-emitting device according to claim 7, wherein the side surface of the transparent resin layer is formed in at least one of a substantially linear shape and a convex shape in an opposite direction of the semiconductor epitaxial layer between the side surface of the wavelength converting layer and the substantially edge portion of the semiconductor chip substrate.

9. The semiconductor light-emitting device according to claim 7, wherein the semiconductor epitaxial layer is a metallic bonding chip emitting blue light and the at least one phosphor of the wavelength converting layer is selected from the group consisting of a yellow phosphor, and two phosphors including a red phosphor layer and a green phosphor layer.

10. The semiconductor light-emitting device according to claim 7, wherein the semiconductor epitaxial layer is a metallic bonding chip emitting an ultraviolet light and the at least one phosphor of the wavelength converting layer includes at least one of a red phosphor, a green phosphor, and a blue phosphor.

11. The semiconductor light-emitting device according to claim 7, wherein the wavelength converting layer includes at least one cutout section, and the at least one cutout section exposes the at least one top electrode of the semiconductor epitaxial layer from the semiconductor epitaxial layer in a top view of the wavelength converting layer in a direction perpendicular to the optical axis of the semiconductor epitaxial layer.

12. A semiconductor light-emitting device, comprising:
a semiconductor chip substrate having a bottom surface, a top surface, a side surface, a substantially edge portion located between the top surface and the side surface and a bottom electrode formed underneath the bottom surface, and the semiconductor chip substrate configured with a reflective substrate;

a semiconductor epitaxial layer having a top surface, a bottom surface, a center located on the top surface, at least one top electrode formed on the top surface of the semiconductor epitaxial layer and an substantially optical axis intersected with the center of the top surface of the semiconductor epitaxial layer at a right angle, and each of the top surface and the bottom surface of the semiconductor epitaxial layer being smaller than the top surface of the semiconductor chip substrate;

a wavelength converting layer having a top surface, a side surface, a bottom surface and a substantially edge portion located between the side surface and the bottom surface, the wavelength converting layer including at least one phosphor, formed in a substantially uniform thickness between the top surface and the bottom surface of the wavelength converting layer, and located over the top surface of the semiconductor epitaxial layer, the bottom surface of the wavelength converting layer facing the top surface of the semiconductor epitaxial layer, and therefore being smaller than the top surface of the semiconductor epitaxial layer; and a transparent resin layer having a side surface disposed on the top surface of the semiconductor epitaxial layer and the top surface of the semiconductor chip substrate, and covering at least the substantially edge portion of the wavelength converting layer, the side surface of the transparent resin layer extending from the side surface of the wavelength converting layer to the substantially edge portion of the semiconductor chip substrate, and therefore inclining from the side surface of the wavelength converting layer toward the substantially edge portion of the semiconductor chip substrate, and the side surface of the transparent resin layer formed in at least one of a substantially linear shape and a convex shape in an opposite direction of the semiconductor epitaxial layer between the side surface of the wavelength converting layer and the substantially edge portion of the semiconductor chip substrate.

13. The semiconductor light-emitting device according to claim 12, wherein the semiconductor epitaxial layer is a metallic bonding chip emitting blue light and the at least one phosphor of the wavelength converting layer is selected from the group consisting of a yellow phosphor, and two phosphors including a red phosphor layer and a green phosphor layer.

14. The semiconductor light-emitting device according to claim 12, wherein the wavelength converting layer is any one of a phosphor film formed in a sheeted shape, which is made by dispersing at least one phosphor in a transparent resin, a phosphor plate formed in a tabular shape, which is made by dispersing at least one phosphor in a transparent resin, a phosphor plate, which is made by sintering at least one phosphor, and a phosphor plate, which is composed of a phosphor glass.

15. A method for manufacturing the semiconductor light-emitting device according to claim 1, comprising:
  providing the mounting board and the semiconductor chip substrate forming the semiconductor epitaxial layer on the top surface of the semiconductor chip substrate;
  mounting the semiconductor chip substrate on the first conductor pattern of the mounting board via the conductive adhesive layer;
  wire-bonding between the top electrode of the semiconductor epitaxial layer and the second conductor pattern of the mounting board via the bonding wire;
  disposing an uncured transparent resin on the top surface of the semiconductor chip substrate and the top surface of the semiconductor epitaxial layer; and
  disposing the wavelength converting layer on the uncured transparent resin using a substantially uniform surface tension between the side surface of the wavelength converting layer and the uncured transparent resin.

16. A method for manufacturing the semiconductor light-emitting device according to claim 2, comprising:
  providing the mounting board and the semiconductor chip substrate forming the semiconductor epitaxial layer on the top surface of the semiconductor chip substrate;
  mounting the semiconductor chip substrate on the first conductor pattern of the mounting board via the conductive adhesive layer;
  wire-bonding between the top electrode of the semiconductor epitaxial layer and the second conductor pattern of the mounting board via the bonding wire;
  disposing an uncured transparent resin on the top surface of the semiconductor chip substrate and the top surface of the semiconductor epitaxial layer; and
  disposing the wavelength converting layer on the uncured transparent resin using a substantially uniform surface tension between the side surface of the wavelength converting layer and the uncured transparent resin.

17. A method for manufacturing the semiconductor light-emitting device according to claim 7, comprising:
  providing the mounting board and the semiconductor chip substrate forming the semiconductor epitaxial layer on the top surface of the semiconductor chip substrate;
  mounting the semiconductor chip substrate on the first conductor pattern of the mounting board via the conductive adhesive layer;
  wire-bonding between the top electrode of the semiconductor epitaxial layer and the second conductor pattern of the mounting board via the bonding wire;
  disposing an uncured transparent resin on the top surface of the semiconductor chip substrate and the top surface of the semiconductor epitaxial layer; and
  disposing the wavelength converting layer on the uncured transparent resin using a substantially uniform surface tension between the side surface of the wavelength converting layer and the uncured transparent resin.

18. A method for manufacturing the semiconductor light-emitting device according to claim 8, comprising:
  providing the mounting board and the semiconductor chip substrate forming the semiconductor epitaxial layer on the top surface of the semiconductor chip substrate;
  mounting the semiconductor chip substrate on the first conductor pattern of the mounting board via the conductive adhesive layer;
  wire-bonding between the top electrode of the semiconductor epitaxial layer and the second conductor pattern of the mounting board via the bonding wire;
  disposing an uncured transparent resin on the top surface of the semiconductor chip substrate and the top surface of the semiconductor epitaxial layer; and
  disposing the wavelength converting layer on the uncured transparent resin using a substantially uniform surface tension between the side surface of the wavelength converting layer and the uncured transparent resin.

19. The method for manufacturing the semiconductor light-emitting device according to claim 15, wherein the wavelength converting layer is any one of a phosphor film formed in a sheeted shape, which is made by dispersing at least one phosphor in a transparent resin, a phosphor plate formed in a tabular shape, which is made by dispersing at least one phosphor in a transparent resin, a phosphor plate, which is made by sintering at least one phosphor, and a phosphor plate, which is composed of a phosphor glass.

20. The method for manufacturing a semiconductor light-emitting device according to claim 17, wherein the wavelength converting layer includes at least one cutout section, and the at least cutout section exposes the at least one top electrode of the semiconductor epitaxial layer from the semiconductor epitaxial layer in a top view of the wavelength converting layer in a direction perpendicular to the optical axis of the semiconductor epitaxial layer.

* * * * *